United States Patent [19]
Abend

[11] Patent Number: 5,544,174
[45] Date of Patent: Aug. 6, 1996

[54] PROGRAMMABLE BOUNDARY SCAN AND INPUT OUTPUT PARAMETER DEVICE FOR TESTING INTEGRATED CIRCUITS

[75] Inventor: Robert J. Abend, Layton, Utah

[73] Assignee: The United States of America as represented by the Secretary of the Air Force, Washington, D.C.

[21] Appl. No.: 214,476

[22] Filed: Mar. 17, 1994

[51] Int. Cl.⁶ .................................................. G01R 31/28
[52] U.S. Cl. ..................................... 371/22.3; 395/183.08
[58] Field of Search ................................ 371/22.3, 22.1, 371/22.2, 22.5, 22.6; 324/158 R, 158.1

[56] References Cited

U.S. PATENT DOCUMENTS

| | | | |
|---|---|---|---|
| 4,930,002 | 5/1990 | Takenaka et al. | 357/75 |
| 4,967,148 | 10/1990 | Doemens et al. | 324/158 F |
| 5,042,034 | 8/1991 | Correale, Jr. et al. | 371/22.3 |
| 5,137,836 | 8/1992 | Lam | 437/8 |
| 5,148,102 | 9/1992 | Rose et al. | 324/158 F |
| 5,155,732 | 10/1992 | Jarwala et al. | 371/22.3 |
| 5,167,512 | 12/1992 | Walkup | 439/66 |
| 5,187,430 | 2/1993 | Marek et al. | 324/66 |
| 5,198,778 | 3/1993 | Akabane | 324/718 |
| 5,200,580 | 4/1993 | Sienski | 174/264 |
| 5,208,729 | 5/1993 | Cipolla et al. | 361/382 |
| 5,241,450 | 8/1993 | Bernhardt et al. | 361/689 |
| 5,247,423 | 9/1993 | Lin et al. | 361/719 |
| 5,276,586 | 1/1994 | Hatsuda et al. | 361/387 |
| 5,281,864 | 1/1994 | Hahn et al. | 307/272.2 |

*Primary Examiner*—Vincent P. Canney
*Attorney, Agent, or Firm*—Bernard E. Franz; Thomas L. Kundert

[57] ABSTRACT

Boundary scan testing of devices such as printed circuit boards and multi chip modules, when the needed circuits have not been provided on IC chips by the manufacturer, is accomplished with a diagnostic and testing integrated circuit that performs a boundary scan external to available integrated circuitry with the addition of programmable input/ output parameters. Programmable boundary scan functions include input or output functions, enable or disable cells, and shift register orders. The boundary scan function programming will allow each boundary scan cell to be defined as an input/output boundary scan cell. The enable cell programmability would provide the capability of shutting down unused cells in a given application to program proper data flow and to conserve power.

1 Claim, 2 Drawing Sheets

Multi Chip Module
with Boundary Scan cells

PROGRAMMABLE BOUNDARY SCAN AND INPUT OUTPUT PARAMETER DEVICE FOR TESTING INTEGRATED CIRCUITS

RIGHTS OF THE GOVERNMENT

The invention described herein may be manufactured and used by or for the Government of the United States for all governmental purposes without the payment of any royalty.

BACKGROUND OF THE INVENTION

The present invention relates generally to a programmable boundary scan and input/output parameter device for testing integrated circuits; and more particularly to a field programmable and configurable boundary scan integrated circuit with programmable input/output parameters.

Boundary scan is an emerging test standard which improves the testability of integrated circuits and their final subassembly apparatus such as a PC board or multi-chip module. The boundary scan concept is defined by the IEEE Std 1149.1–1990: IEEE Standard Test Access Port and Boundary-Scan Architecture, published by the Institute of Electrical and Electronics Engineers, Inc., 345 East 47th Street, New York, N.Y. 10017, U.S.A. As an aid to understanding the standard, see the book by Harry Bleeker, Peter van Den Eijnden and Frans de Jong titled Boundary-Scan Test, a Practical Approach, Kluwer Academic Publishers, 101 Philip Drive, Norwell Mass. 02061, U.S.A. The IEEE standard and the Bleeker et al. book are hereby incorporated by reference as background material, and for their detailed description of boundary scan circuits and test methods.

At present a small percentage of available integrated circuits offer boundary scan capability. Integrated circuit manufacturers are, in some cases, reluctant to add or include boundary scan in specific intergrated circuits due to added complexity, chip size, power dissipation, yield, the fact that many end users may not need boundary scan capability cost and other factors such as circuit performance degradation.

Present manufacturers of printed circuit boards, multi-chip modules, and other electronic digital assemblies also have difficulty in implementing boundary scan testing as required by their application, since many integrated circuits do not provide boundary scan implementation. Many new integrated circuits do not have boundary scan, and manufacturers are reluctant to redesign existing circuits.

The following United States patents are of interest with respect to the present invention.

U.S. Pat. No. 5,198,778—Akabane
U.S. Pat. No. 5,187,430—Marek et al
U.S. Pat. No. 5,148,102—Rose et al
U.S. Pat. No. 4,967,148—Doemens et al The patent to Marek et al discloses a method for determining networks among nodes in a circuit board by applying an electrical stimulus, measuring the response at the nodes, and comparing the measurements to determine a plurality of networks among the nodes. The remaining patents are of less interest.

The following United States patents relate to boundary-scan testing, and are hereby incorporated by reference.

U.S. Pat. No. 5,281,864—Hahn et al
U.S. Pat. No. 5,155,732—Jarwala et al
U.S. Pat. No. 5,042,034—Correale Jr. et al The following United States patents relate to Multi Chip Module (MCM) technology, and are hereby incorporated by reference to show the chip assembly and wire bonding techniques.

U.S. Pat. No. 5,276,586—Hatsuda et al
U.S. Pat. No. 5,247,423—Lin et al
U.S. Pat. No. 5,241,450—Berhardt et al
U.S. Pat. No. 5,208,729—Cipolla et al
U.S. Pat. No. 5,200,580—Sienski et al
U.S. Pat. No. 5,167,512—Walkup
U.S. Pat. No. 5,137,836—Lam
U.S. Pat. No. 4,930,002—Takenka et al

SUMMARY OF THE INVENTION

An objective of the invention is to provide for the use of boundary scan testing of devices, such as printed circuit boards and multi chip modules, when the needed boundary scan test circuits have not been provided on IC chips by the manufacturer. A further objective is to provide programmable functions for the IC chips. The invention provides for a diagnostic and testing integrated circuit that performs a boundary scan external to available integrated circuitry. The diagnostic and testing integrated circuit uses input/output parameters. Programmable boundary scan functions include input or output functions, enable or disable cells, and shift register orders, The boundary scan function programming will also allow each boundary scan cell to be defined as an input/output boundary scan cell. In addition enable cell programmability provides the capability of shutting down unused cells in a given application to program proper data flow and to conserve power.

DETAILED DESCRIPTION

Figure 1:
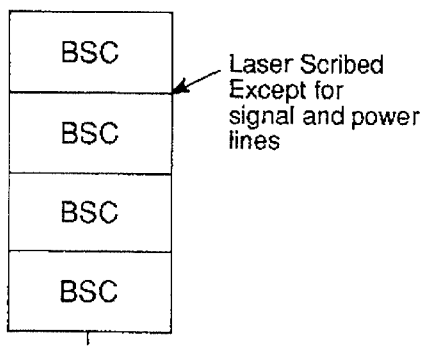
FIG. 1 is a diagram showing a simplified integrated circuit (IC) chip comprising a plurality of boundary scan cells.

The thrust of the invention is the provision of an integrated circuit that performs the boundary scan function external to available integrated circuits with added utility being achieved via the addition of programmable input/output parameters, Boundary scan testing involves the addition of several logic elements which are inserted at the inputs and outputs of the integrated circuit, Since boundary scan elements are on the periphery of the integrated circuit, an external boundary scan cell will function the same as an integrated boundary scan cell.

The external boundary scan cells of the invention are desirably made to be mask or field programmable. Programmable boundary scan functions include:

1. Input or output functions.
2. Enable or disable cell.

3. Shift register order.

Programmable input/output functions may include:
1. Rise and fall time.
2. Logic high and logic zero levels on the outputs.
3. Input and output impedance.
4. Output current in the high and low stages.
5. Input high and low thresholds.

The boundary scan functions programming allows each cell to be defined as an input/output boundary scan cell. The cell enable programmability would provides capability of shutting down unused cells in a given application in order to program proper data flow and to conserve power. Programmable shift register sequencing may also be of value in some applications. Location of the serial "test data in" (TDI) and "test data a out" ports can also be programmed.

Input/output parameter programming adds utility well beyond the boundary scan function. When the proposed boundary scan cell is located adjacent to the digital integrated circuit output of the circuit being enhanced with boundary scan test capability the capacitance being driven by the outputs ports of that circuit are typically reduce by an order of magnitude, at least. Power dissipation modern high speed digital integrated circuits is largely a function of the frequency of operation and the capacitance driven by the output ports on the circuit.

Integrated circuit manufacturers design their output circuits to have extremely fast rise and fall times so that capability of operating at the maximum specified clock frequency is not impaired. Unfortunately this leads to ringing in the circuit output signal and maximizes power dissipation. Since output current is largely a function of C dv/dt, with programmable rise and fall times incorporated in the boundary scan cell, each tested circuit ouput port may have its rise and fall times rise and fall time tailored to specific signal requirements to thereby minimize power dissipation, and minimize ringing that (an cause unnecessary clocking delay at the input of the next device. Crosstalk between signal paths can also be reduced. Programmable output drive currents allow each boundary scan cell to be matched to the network that it is driving; also reducing power dissipation. Programmable input and output levels afforded by the device allows low voltage signal transmission, further reducing crosstalk and power dissipation. Programmable input and output impedances allow the use of matched transmission lines, further enhancing signal integrity and reducing crosstalk.

In order to match the required topography on a Multi Chip Module (MCM) application, the chip should prefereably be long and narrow in its physical shape, as shown in FIG. 1; the device may however be manufactured in other shapes. The long narrow version shown in FIG. 1 can laser scribed so that its length can customized by the user. The laser scribe line may enclose signal and power and ground lines to the next BSC (Boundary Scan Cell), and accommodate user configuration.

Figure 2:
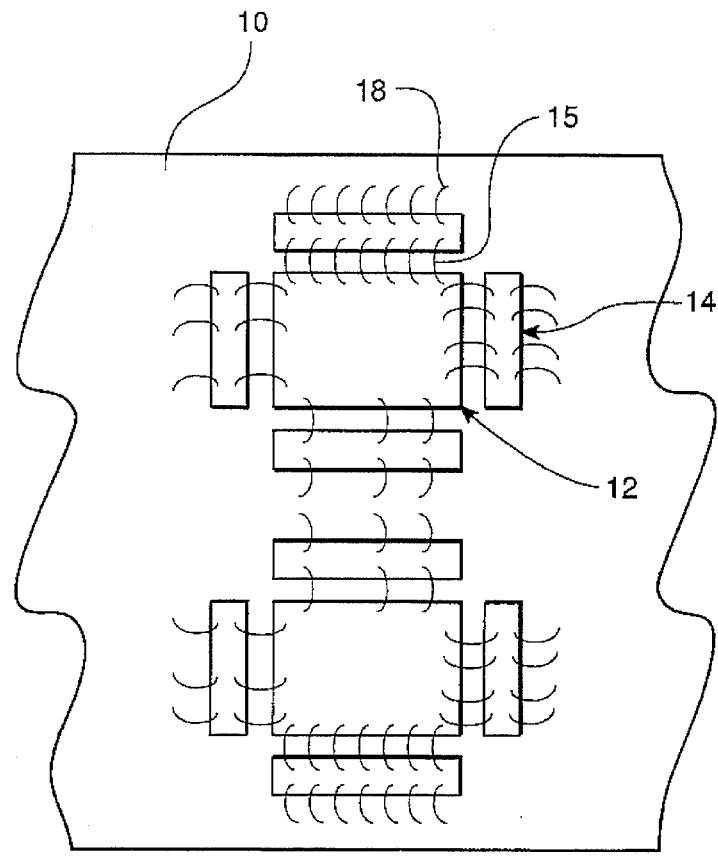
FIG. 2 is a top view of a multi chip module with boundary scan circuits on separate IC chips for testing an IC digital logic chip.

FIG. 2 shows an example of how the device might be used on an MCM substrate 10, having typical digital IC chips 12. The boundary scan devices 14 are bonded to the IC devices 12 via bond wires 16, and to the substrate via bond wires 18. The BSC device may also be packaged on PC boards. Wire bonding between the BSC device may also be accomplished by wire bonding from the host digital device to the substrate and then from the substrate to the BSC device; but this is less efficient.

Figure 3:
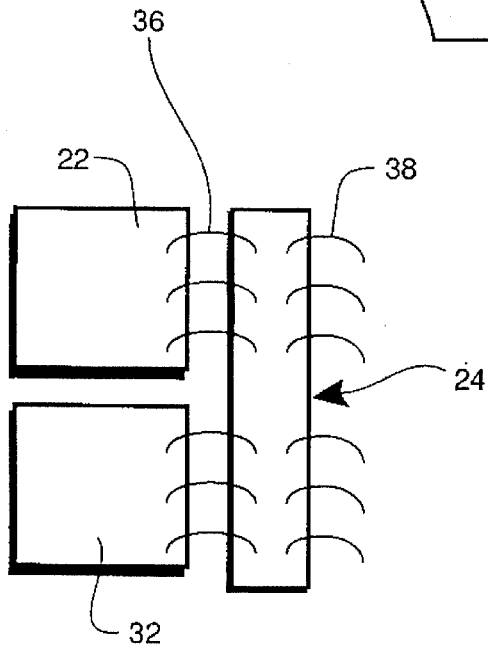
FIG. 3 is diagram showing a boundary scan device used to test more than one IC device.

The BSC device may also be used to provide boundary scan and programmable input/output parametrics for more than one device as shown in FIG. 3. A plurality of standard IC chips 22 and 32 are connected via wire bonds 36 to a single boundary scan device 24. Wire bonds 38 connect the boundary scan device 24 to the substrate.

Figure 4:
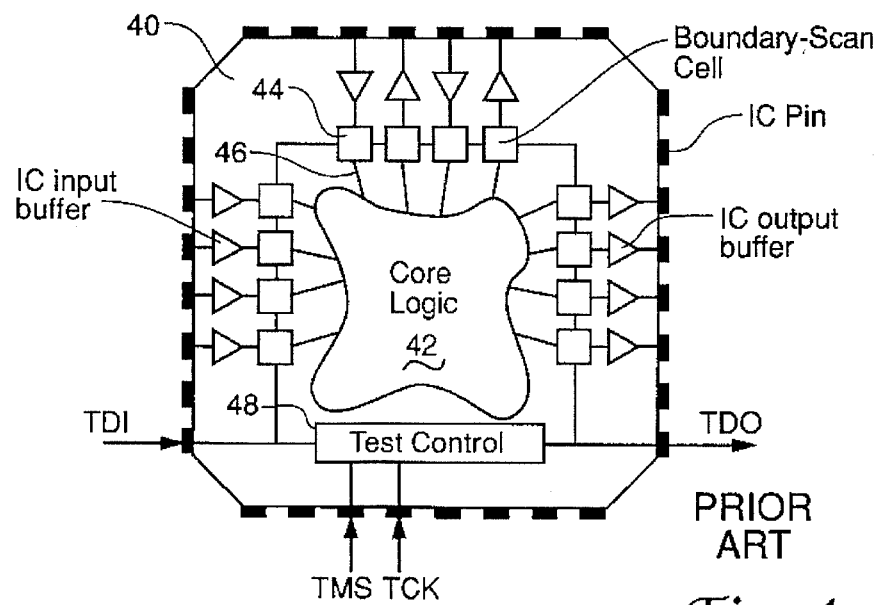
FIG. 4 is a diagram of a typical prior art IC including boundary scan register and test control circuits provided by the IC manufacturer on the same chip.

FIG. 4 shows a typical prior art IC which includes a boundary-scan register and test control circuits on the same chip with the core logic 42. The boundary test circuits include a number of boundary test cells 44, and a test control circuit 48. Each cell 44 is connected to the core logic, and also via an IC input buffer an IC output buffer to an IC pin. The four pins (TMS, TCK, TDI and TDO) are referred to as the Test Access Port or TAP. The entire test control logic is consequently called the TAP Controller. Each of the boundary scan cells 44 includes a shift register stage.

Figure 5:
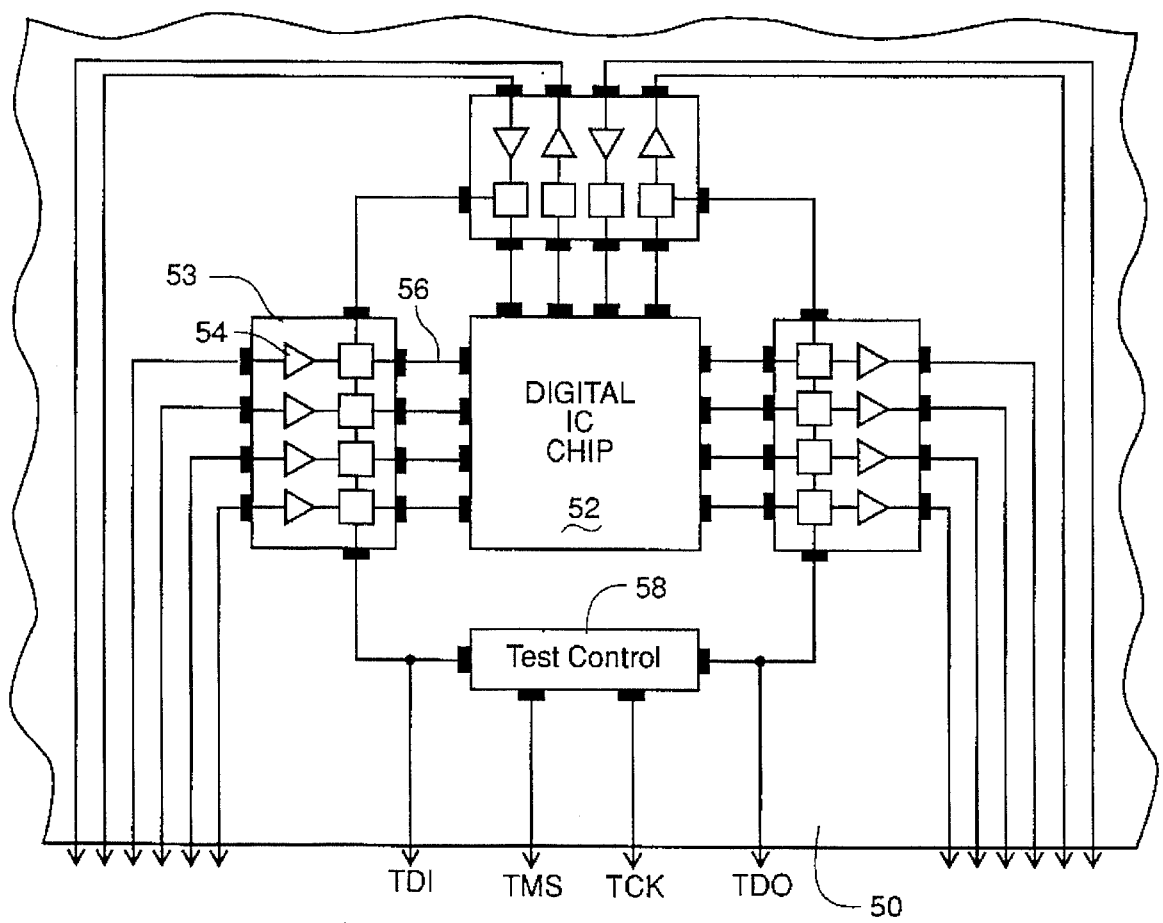
FIG. 5 is a diagram of a printed circuit board having an IC logic chip associated with boundary test devices located on separate IC chips.

FIG. 5 shows a circuit similar to FIG. 4, but in which only the core logic is provided by the manufacturer on a standard digital IC chip 52. According to the invention, the boundary test circuits are then provided on a multi chip module or printed circuit board by separate IC chips. An embodiment on a printed circuit board 50 is shown in FIG. 5. The boundary test cells 54 along with input or output buffers are provided on IC chips 53, which are connected via printed circuit wiring 56 between IC pins from the chips 53 to the main IC chip 52 (Usually IC sockets are used, but they have been omitted to simplify the drawing). The boundary test circuits include a test control circuit shown here on a separate chip 58. All of the boundary test cells 54 and the test control circuit may be provided in a single IC chip. Also, a single IC chip may contain the boundary test cells and test control circuit for a number of digital IC chips. The boundary test circuits are shown in FIG. 5 as having connections from IC pins to a printed circuit board connector at the bottom of the figure.

The IC devices such as chip 12 in FIG. 2, chips 22 and 32 in FIG. 3, and chip 52 in FIG. 5, may be referred to as host devices or host IC chips. These devices or chips correspond to the "core logic" in FIG. 4.

In applications that are not sensitive to speed considerations, applications wherein factors such as net capacitance are of small concern, the boundary scan device may be located in a remote position relative to the host device.

Implementation of the boundary scan device may use elective connection arrangements such as fusible links fusible links, programmable connections, UV erasable memory, laser frim, or other available technologies.

Functionality of the boundary scan device will provide compliance with IEEE standard 1149.1

A boundary scan controller preferably included in each boundary scan device, central controller for multiple devices may be feasible as well. If central control is used, the complexity of each boundary scan device is reduced.

Advantages of the external boundary scan device include be;
1. Reduced complexity of digital integrated circuits that use the external boundary scan device.
2. Reduced pin count on digital devices that use the external BSC device.
3. Higher speed due to programmable I/O parameters.
4. Lower power dissipation.
5. Less crosstalk between signal nets.
6. Less ground and power noise.
7. User configuration of boundary scan and I/O parameters customized.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. Apparatus for boundary scan testing a boundary scan test provision-free multi chip module integrated circuit assembly having host integrated circuit chips and interconnecting wiring, said apparatus comprising:

boundary scan test means including test integrated circuit chip means external to said host integrated circuit chips, said test integrated circuit chip means being part of said integrated circuit assembly;

said test integrated circuit chip means including a plurality of boundary scan cells and a plurality of integrated circuit test chips of laser scribed line-user configurable long and narrow physical shape wherein a laser scribe line encloses signal, power and ground lines to a next boundary scan cell;

means connecting said test integrated circuit chips to said host integrated circuit chips and to other circuits in said integrated circuit assembly; and programmable means providing said test integrated circuit chip means with boundary scan functions consisting of input and output functions, enable and disable cells, shift register orders, rise and fall time data, logic high and logic zero output levels, input and output impedance functions, output current in the high and low states, input high and low thresholds and boundary scan cell input and output-defining programmable parameters;

said enable and disable cells also being programmable with proper data flow determining and power conserving capability for unused cell shutdown.

* * * * *